United States Patent [19]
Yoshida et al.

[11] Patent Number: 6,057,565
[45] Date of Patent: May 2, 2000

[54] SEMICONDUCTOR LIGHT EMITTING DEVICE INCLUDING A NON-STOICHIOMETRIC COMPOUND LAYER AND MANUFACTURING METHOD THEREOF

[75] Inventors: Hiroaki Yoshida; Masayuki Ishikawa, both of Yokohama; Hidetoshi Fujimoto, Kawasaki; Yoshihiro Kokubun; Genichi Hatakoshi, both of Yokohama, all of Japan

[73] Assignee: Kabushiki Kaisha Toshiba, Kawasaki, Japan

[21] Appl. No.: 08/937,166

[22] Filed: Sep. 25, 1997

[30] Foreign Application Priority Data

Sep. 26, 1996 [JP] Japan .................................. 8-254959

[51] Int. Cl.[7] .................................................. H01L 33/00
[52] U.S. Cl. .......................... 257/102; 257/103; 257/96; 372/45
[58] Field of Search ............................... 257/94, 96, 102, 257/103, 12, 13; 372/45, 46

[56] References Cited

U.S. PATENT DOCUMENTS

| | | | |
|---|---|---|---|
| 5,693,963 | 12/1997 | Fujimoto et al. | 257/102 |
| 5,740,192 | 4/1998 | Hatano et al. | 257/102 |
| 5,825,052 | 10/1998 | Shakuda | 257/103 |

FOREIGN PATENT DOCUMENTS

| | | |
|---|---|---|
| 4-242985 | 8/1992 | Japan . |
| 8-97507 | 4/1996 | Japan . |
| 8-330629 | 12/1996 | Japan . |

*Primary Examiner*—Minh Loan Tran
*Attorney, Agent, or Firm*—Oblon, Spivak, McClelland, Maier & Neustadt, P.C.

[57] ABSTRACT

In the semiconductor light emitting device, a high resistance layer formed by mutual diffusion at an interface with the substrate crystal can be eliminated, and a low resistance p-type contact can be realized. In addition, it is possible to reduce the leak current when an internal current-blocking structure is formed. In practice, a compound semiconductor layer offset in composition ratio stoichiometrically is used as the contact layer. Further, when a predetermined element is added to the contact layer, a large amount of doping can be enabled in comparison with when impurities are added to the ordinary GaN based layer. Therefore, a high concentration conductive type layer can be realized while reducing the contact resistance. In addition, when the compound semiconductor layer offset away from the stoichiometric composition is used as the current-blocking layer, the current-blocking efficiency can be improved. Further, when the substrate is irradiated with light having energy slightly higher than that of the band gap of the grown crystal in the photo-excitation MOCVD method in order to eliminate the rough surface, it is possible to realize the p-type conductive of high carrier concentration.

17 Claims, 7 Drawing Sheets

SEMICONDUCTOR LIGHT EMITTING DEVICE INCLUDING A NON-STOICHIOMETRIC COMPOUND LAYER AND MANUFACTURING METHOD THEREOF

BACKGROUND OF THE INVENTION

1. Field of the Invention

The present invention relates to a compound semiconductor device, and more specifically to a chalcogenide compound or gallium nitride based compound semiconductor light emitting device and a method of manufacturing the same device.

2. Description of the Prior Art

Recently, as semiconductor light emitting devices for emitting light in the wavelength range between green and blue, light emitting devices using ZnSe based materials of the II-VI group compound semiconductor or using GaN based material of the III-V group compound semiconductor are now intensively being researched and developed. In the recent research level, some light emitting diodes or semiconductor laser devices have been manufactured by way of trial in both the cases of ZnSe and GaN based materials In more detail, in the case of the II-VI group compound semiconductor, ZnSe based material of zinc chalcogenide is now being developed. Further, in the recent research level, its crystal growth has been realized in accordance with an MBE (molecular beam epitaxy) method. However, the research level described above is far from a production level. Further, when a metal-organic chemical vapor deposition (MOCVD) method is adopted, since it is difficult to realize a p-type conductive semiconductor layer, there is little prospect for realization of the light emitting devices using the same material.

On the other hand, in the case of the GaN based semiconductor, although some light emitting diodes have been already realized in accordance with the MOCVD method, the semiconductor laser device has not yet reached the product level which can be put on the market. This is because the resistance components not related to the light emission is relatively large, with the result that the quantity of heat generated by the laser element is large and thereby the lifetime thereof is short. Further, in the case of the GaN based light emitting devices, since the melting point of the crystal thereof is relatively high, there exists a difficulty in crystal growth. In addition, the crystal is not easily etched by use of acid or alkali, it is very difficult to process the element thereof.

In this specification, [gallium nitride based semiconductor] or [GaN based semiconductor] implies all the semiconductors having compositions obtained by changing the composition ratios of x and y in each range of the chemical formula expressed by $In_xAl_yGa_{1-x-y}N$ ($0 \leq x \leq 1$, $0 \leq y \leq 1$, $x+y \leq 1$). For instance, InGaN (x=0.4, y=0) is also included in [gallium nitride based semiconductor].

Here, in the conventional GaN based semiconductor laser, the manufacturing process is as follows: First, an n-type GaN contact layer, an n-type AlGaN cladding layer, an InGaN active layer, a p-type AlGaN cladding layer, and a p-type GaN contact layer are deposited or laminated in sequence on a sapphire substrate. Then, a p-side electrode is formed on a p-side surface thereof. In addition, a part of the n-type GaN layer is etched by dry etching method, to form an n-side electrode.

Further, in addition to the above-mentioned process, a trial of reducing the laser oscillation threshold current has now been made by injecting electrons into the part of the active layer in a high density. In this process, an insulating layer is formed just under the p-side electrode to narrow the current path, or else an internal current-blocking structure is formed by dividing the crystal growth process into two times.

In the conventional light emitting devices of ZnSe based semiconductor realized in accordance with the above-mentioned MBE method, a serious problem exists in that the device reliability cannot be yet secured. It is considered that this problem results from the GaAs substrate and the p-type electrode. In more detail, since the lattice constant is slightly different between GaAs and ZnSe, when current flows, the mutual diffusion of the composing elements is further promoted and thereby the diffused elements interact with each other as dopant, with the result that a high resistance layer is inevitably formed in the interface between the two layers. Further, in the same way as with the case of the aforementioned GaN, since a good ohmic contact has not been yet realized at the electrode contact, a relatively high voltage is applied to the electrode portion when current flows, so that there exists a problem in that the device deteriorates in an extremely short time due to the heat generation thereat.

In the case of the II-VI group compound semiconductor, the method of doping p-type impurities has not yet been established well in the MOCVD method. In more detail, although the adding method can be attained partially by use of lithium (Li) of the I group, the carrier concentration is now as low as about $10^{16} cm^{-3}$. When ZnSe is used as the substrate, the problem related to the interface can be solved. In this case, the iodine method is now considered as a method of causing the least crystal defects in the substrate. However, if the substrate obtained by the iodine method is adopted and Ga of the III group element is used as the additive impurities in the first layer on the substrate, there so far exists a problem in that the substrate resistivity increases due to the diffusion of the additive impurities. A photo-excitation MOCVD method by using a light source having light emission wavelength less than 200 nm (e.g., excimer laser or mercury lamp, etc.)has been adopted for relatively long time. However, since the roughness of the grown surface is prominent, the method cannot be used from the practical standpoint.

On the other hand, in the case of the GaN based compound of the III-V group semiconductor, there exists such a tendency that the resistivity of the p-type contact increases with increasing band gap. Therefore, a serious technical problem is how to reduce the resistivity of the p-type contact in order to secure the reliability of the semiconductor laser. In other words, since a large contact resistance exists between the p-type GaN contact layer and the p-side electrode, a large voltage drop is inevitably produced at this contact portion, thus resulting in an unstable laser operation or unstable laser oscillation due to the heat generation. To overcome these problems, Japanese Published Unexamined (Kokai) Patent Application No. 8-330629 discloses such a method of introducing a large amount of dopant (e.g., Mg) near the surface of the p-type contact whenever the p-type contact is formed.

In this method, even if Mg is added, the attainable maximum carrier concentration is as low as about $10^{18} cm^{-3}$ and the activation ratio (i.e., the proportion of the effective number of carriers to the added impurities) is as extremely low as 1 percent. In addition, even if the impurities are added excessively beyond the above value, the carrier concentration is saturated and the activation ratio decreases abruptly beyond a certain value. Under these circumferences, even if the impurities are added to the compound semiconductor having the stoichiometric composition, there still exists a problem in that it has been difficult to form an ohmic contact of sufficiently low resistivity.

On the other hand, in order to reduce the threshold current of the laser oscillation, it is necessary to adopt the internal current-blocking structure as already explained. However, in the case of the GaN based semiconductor laser having the internal current-blocking structure using $SiO_2$ as the current blocking layer as disclosed in Japanese Published Unexamined (Kokai) Patent Application No. 4-242985, a difference in thermal expansion ratio between $SiO_2$ and GaN causes leak current at the interface thereof, thus resulting in a problem in that the device performance deteriorates. There exists a trial of using a semi-insulating GaN or n-type GaN as the current blocking layer, as disclosed in Japanese Published Unexamined (Kokai) Patent Application No. 8-975071. However, since the current cannot be reduced sufficiently by using those GaN layers, a laser diode having low threshold current has not yet been obtained.

SUMMARY OF THE INVENTION

It is the object of the present invention to provide a chalcogenide compound semiconductor light emitting device including sulfur, zinc or selenium such that a high resistance layer at the interface with the substrate due to the elemental mutual diffusion can be eliminated and thereby it is possible to realize a low resistance p-type contact on the p-type conductive layer having a high carrier concentration in accordance with the MOCVD method.

Another object of the present invention is to provide a light emitting device using the GaN based compound semiconductor such that the p-type contact resistance can be reduced and in addition the leak current can be reduced in the internal current-blocking structure.

To achieve the above-mentioned object, the present invention provides a semiconductor light emitting device, comprising: a light emitting layer; a non-stiochiometric compound layer formed of a compound semiconductor having a composition offset away from its stoichiometric composition; and at least one electrode.

Further, the present invention provides a semiconductor light emitting device, comprising: a light emitting layer formed of a gallium nitride based semiconductor; a non-stiochiometric compound layer formed of the gallium nitride based semiconductor having a composition offset away from its stoichiometric composition; and at least one electrode, and wherein said non-stiochiometric compound layer includes a compound layer satisfied with the following condition: $(x_1+x_2+x_3) \neq y$ in a composition formula expressed by $In_{x1} Ga_{x2} Al_{x3} N_y M_z$, where M denotes an additive element to the gallium nitride based semiconductor and $x_1 \geq 0$, $x_2 \geq 0$, $x_3 \geq 0$, $y>0$, and $z \geq 0$, further said compound layer being at least one of a compound layer in which a quotient obtained by dividing an absolute value of $(x_1+x_2+x_3-y)$ by y is more than 0.0001 and another compound layer in which a quotient obtained by dividing an absolute value of $(x_1+x_2+x_3-y-z)$ by $(y+z)$ is more than 0.0001.

Further, the present invention provides a chalcogenide compound semiconductor light emitting device, comprising: an n-type conductive ZnSe substrate containing iodine; a zinc-chalcogenide layer formed on said substrate and containing one of the Group-VII elements; a first p-type conductive ZnSe layer formed on said zinc-chalcogenide layer and containing one of the Group-V elements; a second p-type conductive ZnSe layer formed on said first conductive ZnSe layer and having a zinc or selenium excessive layer containing one of the Group-V elements; and two electrodes formed on said second conductive p-type conductive ZnSe layer and said n-type conductive ZnSe substrate, respectively.

Further, the present invention provides a semiconductor light emitting device, comprising: a first conductive type SiC substrate; a buffer layer formed on a upper surface of said SiC substrate; a first conductive type cladding layer formed of a gallium nitride based semiconductor; a light emitting layer formed of the gallium nitride based semiconductor; a second conductive type cladding layer formed of the gallium nitride based semiconductor; a second conductive type contact layer; a first electrode formed on a lower surface of said SiC substrate; and a second electrode formed on said contact layer, and wherein said buffer layer includes a non-stiochiometric compound layer formed of the gallium nitride based semiconductor having a composition offset away from its stoichiometric composition.

Further, the present invention provides a semiconductor light emitting element, comprising: a first conductive type SiC substrate; a first conductive type cladding layer formed of a gallium nitride based semiconductor; a light emitting layer formed of the gallium nitride based semiconductor; a second conductive type cladding layer formed of the gallium nitride based semiconductor; a second conductive type contact layer; a first electrode formed on a reverse surface of said SiC substrate; and a second electrode formed on said contact layer, and wherein said contact layer includes a non-stiochiometric compound layer formed of the gallium nitride based semiconductor having a composition offset away from its stoichiometric composition.

Further, the present invention provides a semiconductor light emitting element, comprising: a first conductive type SiC substrate; a first conductive type cladding layer formed of a gallium nitride based semiconductor; a light emitting layer formed of the gallium nitride based semiconductor; a second conductive type cladding layer formed of the gallium nitride based semiconductor; a first conductive type current-blocking layer; a second conductive type contact layer; a first electrode formed on a lower surface of said SiC substrate; and a second electrode formed on said contact layer, and wherein said current-blocking layer includes a non-stiochiometric compound layer formed of the gallium nitride based semiconductor having a composition offset away from its stoichiometric composition.

Further, the present invention provides a semiconductor light emitting element, comprising: a first conductive type SiC substrate; a first conductive type cladding layer formed of a gallium nitride based semiconductor; a light emitting layer formed of the gallium nitride based semiconductor; a second conductive type cladding layer formed of the gallium nitride based semiconductor; a current-blocking layer of high resistivity; a second conductive type contact layer; a first electrode formed on a lower surface of said SiC substrate; and a second electrode formed on said contact layer, and wherein said current blocking layer includes a non-stiochiometric compound layer formed of the gallium nitride based semiconductor having a composition offset away from its stoichiometric composition.

Further, the present invention provides a method of manufacturing a semiconductor light emitting element by forming semiconductor layers on a substrate disposed within a reaction vessel, while supplying source material gases of the Group-III and the Group-V elements, respectively into the reaction vessel, which comprises: a step of forming a gallium nitride based semiconductor layer having a stoichiometric composition on the substrate, by supplying the source material gas of the Group-III elements and the source material gas of the V group element at a first supply ratio; and a step of forming a non-stiochiometric compound layer formed of a gallium nitride based semiconductor having a composition offset away from its stoichiometric composition, by supplying the source material gas of the Group-III elements and the source material gas of the Group-V element at a second supply ratio less than 1/10 or more than 10 of the first supply ratio.

Further, the present invention provides a method of manufacturing a chalcogenide compound semiconductor light emitting element by use of such a crystal growth method that respective layers thereof are formed at temperature lower than 400° C. in accordance with organo-metallic chemical vapor deposition method, while irradiating light having a line spectrum of light whose wavelength is slightly shorter than a wavelength corresponding to ZnSe band gap upon a principal plane of an n-type conductive ZnSe substrate containing iodine and disposed in a reaction vessel and further by supplying zinc and selenium raw material gases into the reaction vessel, which comprises: a step of forming an n-type ZnSe layer containing the Group-VII element on the substrate by the crystal growth method; a step of forming a zinc-chalcogenide layer containing zinc or cadmium, on the formed n-type ZnSe layer by the same crystal growth method; a step of forming a first p-type conductive ZnSe layer containing the Group-V element, on the formed zinced chalcogenide layer by the same crystal growth method; a step of forming a second p-type conductive ZnSe layer having a zinc or selenium excessive layer containing the Group-V element by changing the source material supply ratio of zinc to selenium abruptly between 0 and 100, on the first p-type conductive ZnSe layer by the same crystal growth method; and a step of forming two electrodes on the second p-type conductive ZnSe layer and a lower surface of the n-type conductive ZnSe substrate, respectively.

As described above, in the semiconductor light emitting device according to the present invention, various effects can be attained as follows:

First, a low resistance p-type contact can be realized stably by an extremely thin transition layer formed between the electrode and the p-type conductive layer. In the case of the zinc-chalcogenide based material, since the impurities added to the interface with the substrate crystal are the Group-VII element, it is impossible to form a high resistance layer due to the mutual diffusion. Further, in the case of the MOCVD method, since the roughness on the growth surface is excellent, it is possible to realize a high concentration p-type conductive semiconductor of fine surface roughness, so that it is possible to first realize the semiconductor light emitting device of high performance and high reliability.

Further, since the GaN layer offset away from the stoichiometric composition is used as the current blocking layer and since a predetermined element is added to this GaN layer, a great amount of impurities can be added to the GaN layer as compared with the case of the conventional GaN layer, so that it is possible to control the conductive semiconductor from low concentration to more high concentration. In addition, when the additive element is selected, since the high resistivity can be realized, it is possible to provide an excellent current-blocking layer.

Further, since a transition layer offset in composition ratio between the Group-III element and the Group-V element is formed between the electrode for realizing a low resistance electrode contact and the compound semiconductor layer, it is possible to form a stable low resistance electrode contact. Further, since a larger amount of elements other than the Group-III element or the Group-V element can be added to the gallium nitride based compound offset in composition ratio, as compared with the conventional gallium nitride based compound, dopant can be introduced more positively into the transition layer offset in composition ratio stoichiometrically, with the result that it is possible to reduce the contact resistance, as compared with the conventional contact.

Further, a large amount of any metallic elements for constituting the electrode can be introduced into the contact layer offset in composition ratio stoichiometrically, as compared with the conventional contact layer. As a result, the contact layer can be well alloyed with the electrode, so that the contact resistance can be further reduced.

Further, when the transition layer offset in composition ratio stoichiometrically is adopted as the contact layer or as the current blocking layer, it is possible to realize a semiconductor light emitting device of high performance and high reliability, so that the industrial effect is large.

DETAILED DESCRIPTION OF THE PREFERRED EMBODIMENTS

According to the present invention, a compound semiconductor layer whose composition is offset away from its stoichiometric composition is used as the contact layer.

By adding the impurities the contact layer described above, a larger amount of doping, in comparison with the ordinary GaN based material, is realized. As a result, it is possible to realize a high concentration conductive semiconductor and thereby to reduce the contact resistance thereof.

In addition, according to the present invention, the compound semiconductor whose composition is offset away from its stoichiometric composition is used as the current-blocking layer. Further, the above-mentioned elements are added to improve the dopant activation ratio and thereby to realize a high resistivity. As a result, it is possible to improve the current-blocking efficiency and thereby to realize a low threshold of the laser device.

Some embodiments of the present invention will be described in detail hereinbelow with reference to the attached drawings.

1st Embodiment

Figure 1:
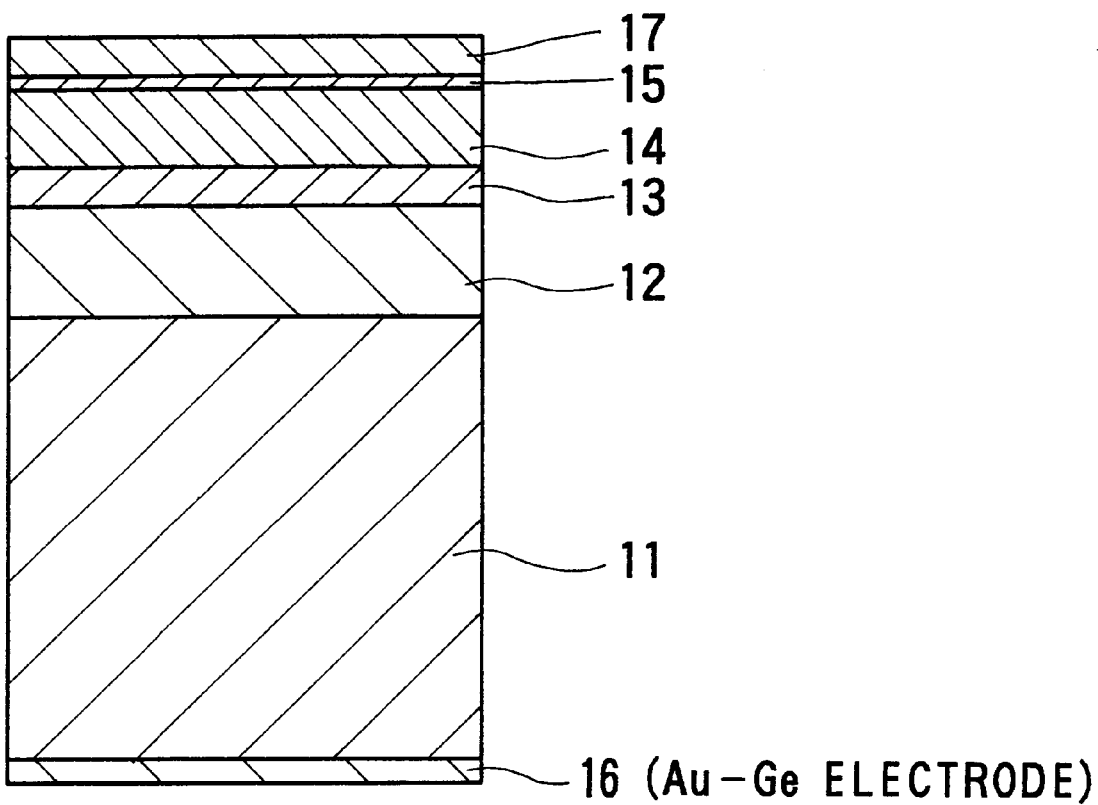
FIG. 1 shows a cross-sectional view showing a first embodiment of the semiconductor light emitting device according to the present invention.

FIG. 1 shows a cross-sectional view showing the first embodiment of the light emitting device according to the present invention, in which a ZnSe crystal light emitting device is shown by way of example.

Figure 2:
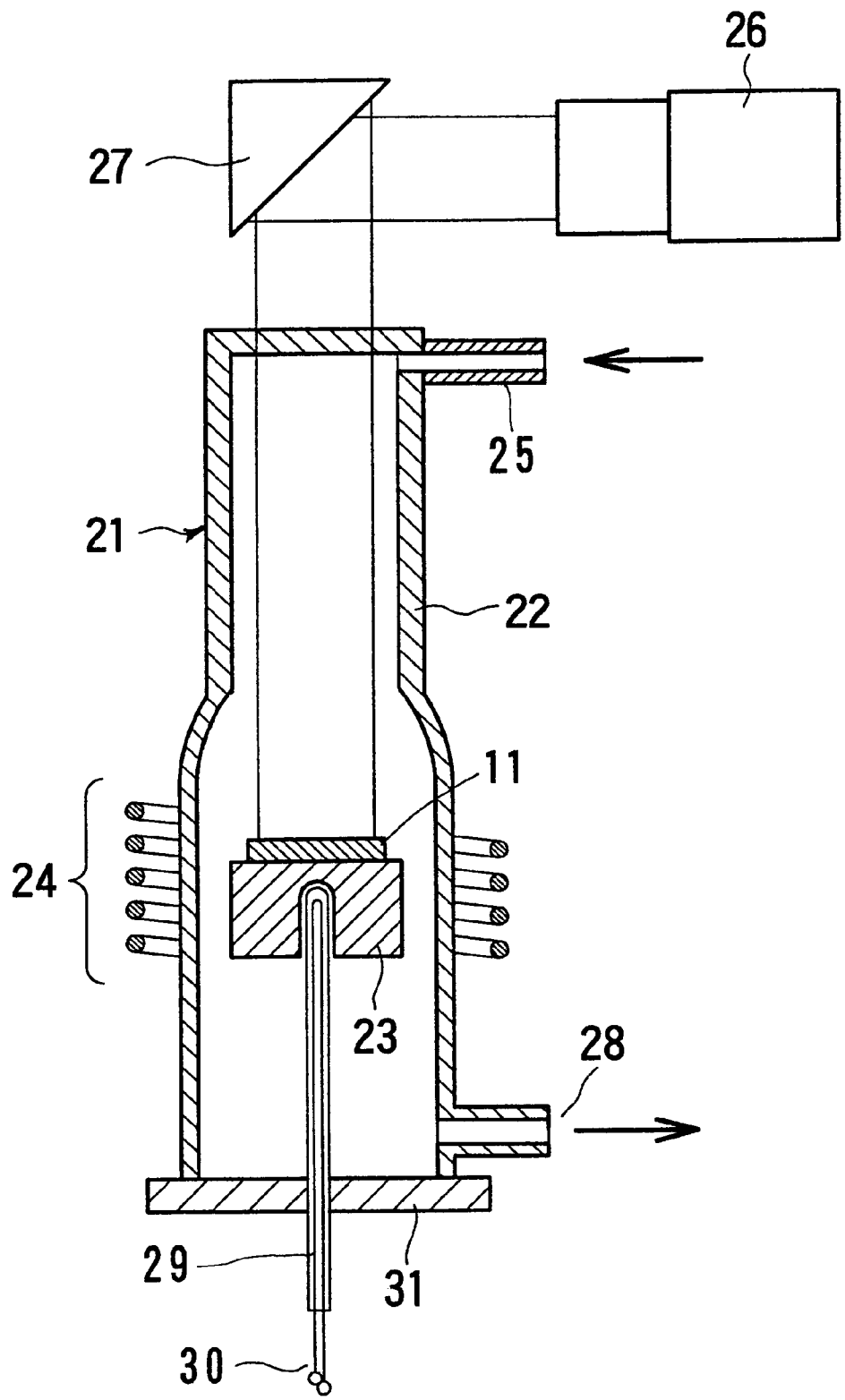
FIG. 2 shows a cross-sectional view showing a diagrammatic structure of the manufacturing instrument of the semiconductor light emitting device shown in FIG. 1.

In accordance with iodine transit method, a ZnSe crystal had been treated at 800° C. for about 2 hours in a melted zinc. Then, a wafer having a (100) surface was cut and the surface was polished. The substrate wafer was etched at 25° C. for 100 sec with an etching solution consisting of sulfuric acid, hydrogen peroxide and water at a ratio of 10:1:1, to obtain an n-type ZnSe substrate 11 containing iodine of 10 ppm or more. After the excessive selenium had been removed from the substrate surface, the substrate 11 was mounted on a carbon susceptor 23 disposed within a reaction vessel 22 of a crystal growth instrument 21 as shown in FIG. 2. Further, the substrate 11 was heated up to 500° C. by use of an RF coil 24 and baked under the atmospheric pressure for 20 min within a hydrogen atmosphere. Then, dimethyl zinc and dimethyl selenium were supplied, as sources of both zinc and selenium, through a gas supply port 25 provided at the upper portion of the reaction vessel 22. In addition, Cl was introduced into the reaction vessel 22 as additive impurities. The growth pressure was kept at 100 torr. On the other hand, the substrate 11 arranged within the reaction vessel 22 was irradiated with a light emitted from an ultra-high pressure mercury lamp 26 via a mirror 27, to grow a Cl-doped ZnSe layer 12 as a first layer shown in FIG. 1. The ratio of VI (Se) /II (Zn), that is, the ratio of dimethyl zinc and dimethyl selenium supplied as the sources of zinc and selenium was 2.0. These raw materials were kept supplied just prior to the growth ends of the respective layers shown in FIG. 1. The second layer shown in FIG. 1 is a ZnCdSe layer, in which the composition ratio of zinc and cadmium was 8:2. A nitrogen added ZnSe layer 14 was grown as the third layer by use of additive impurities of tertiary butyl amine and nitrogen. Just prior to the growth end of this layer 14, a nitrogen added ZnSe contact layer 15 was formed as a fourth layer by reducing the amount of supplied zinc material down to 1/10. On the growth layers formed as described above, an n-side electrode 16 was formed on the lower surface of the substrate by depositing Au-Ge. On the other hand, a p-side electrode 17 was formed on the fourth layer 15 by depositing Au. Then, substrate 11 was diced to separate the substrate 11 into individual chips.

In the crystal growth instrument 21 shown in FIG. 2, a gas discharging port 28 is formed at the lower portion of the reaction vessel 22. Further, a thermocouple 29 for controlling the substrate temperature is buried in the carbon susceptor 23, and two leads 30 of the thermocouple 29 are led to the outside through a bottom portion 31 of the reaction vessel 22.

Figure 3:
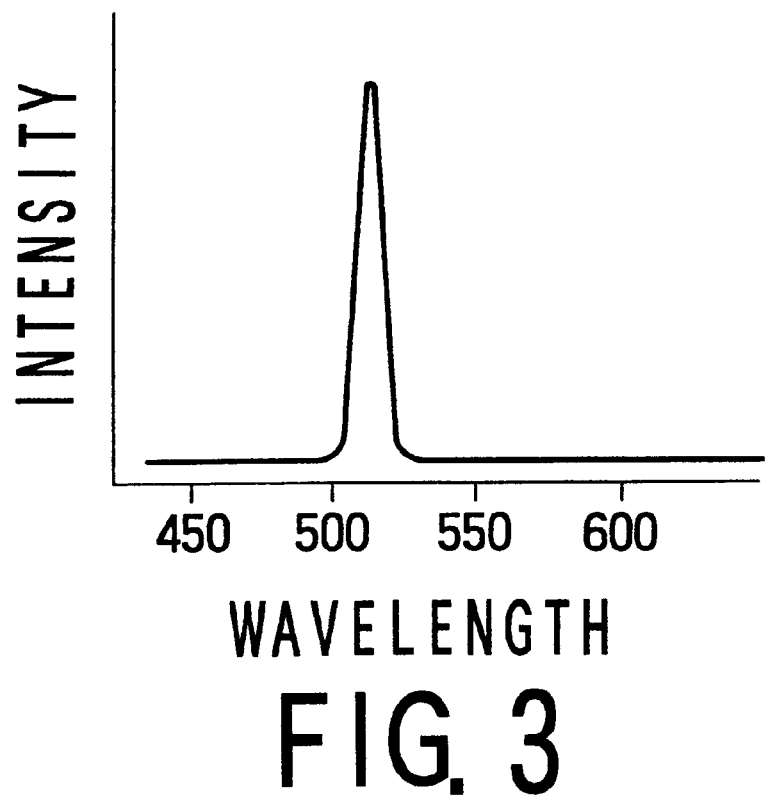
FIG. 3 shows a graphical representation showing an example of emission spectrum of the semiconductor light emitting device shown in FIG. 1.

FIG. 3 shows the light emission spectrum of the light emitting devices according to the present invention, which indicates that the color purity is high such a way that the half value width is as narrow as 10 nm with 510 nm as its center. Light was emitted from the light emitting device at the driving voltage as low as 2.8 V, and the emission corresponding to 2 cd was obtained at 3 V. Further, since the transition layer of the fourth layer 15 contacting with the p-side electrode 17 of Au was very thin, although it was not necessarily easy to confirm the presence of this layer 15 with the naked eyes, the feature thereof was that the fourth layer 15 was seen slightly black. In the first embodiment, when the light was not used during the crystal growth process, the epitaxial layers were not grown at all. In the case where a low pressure mercury lamp having the light emission spectrum with wavelengths less than 200nm was used, the surface of the grown layer was rough, resulting that the leak current was large without emitting any light or that the drive voltage was high, with the result that any practical samples were not obtained. In the case where Ga was used as the additive impurities for the first layer 12, although the light emitting devices initially showed an emission at a voltage of about 3 V, the resistance thereof has immediately increased and the light emission has been terminated.

Figure 4:
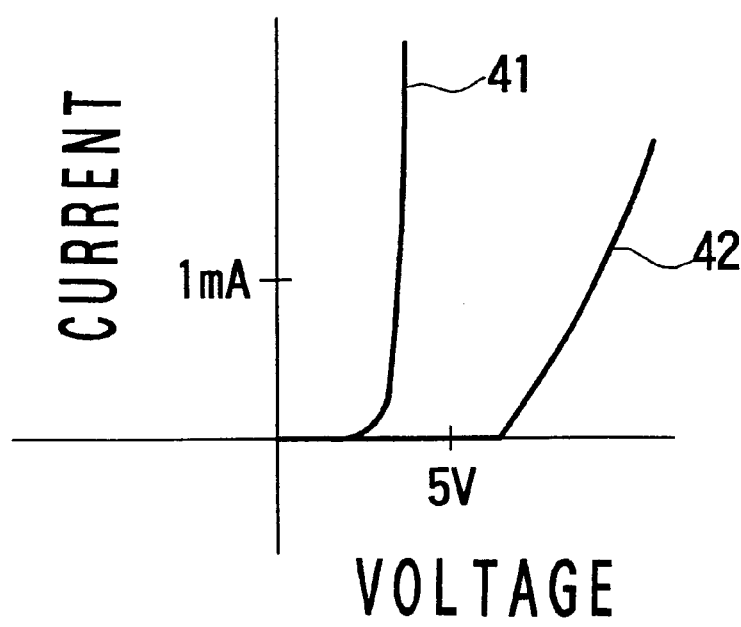
FIG. 4 shows a graphical representation showing current-voltage characteristics of the semiconductor light emitting device shown in FIG. 1, together with those of a comparison example.

FIG. 4 shows the current-voltage characteristics of the light emitting device based upon this first embodiment, in which a curve denoted by 41 shows those of the present invention and a curve denoted by 42 shows those of a comparative sample. In this comparative example, the fourth layer (the ZnSe contact layer) 15 was not formed. FIG. 4 indicates that the comparative curve 42 does not show perfect diode characteristics and the threshold voltage is as high as about 5 V. This comparative diode initially showed a light emission, however, the light emission deteriorated within several minutes.

2nd Embodiment

Figure 5:
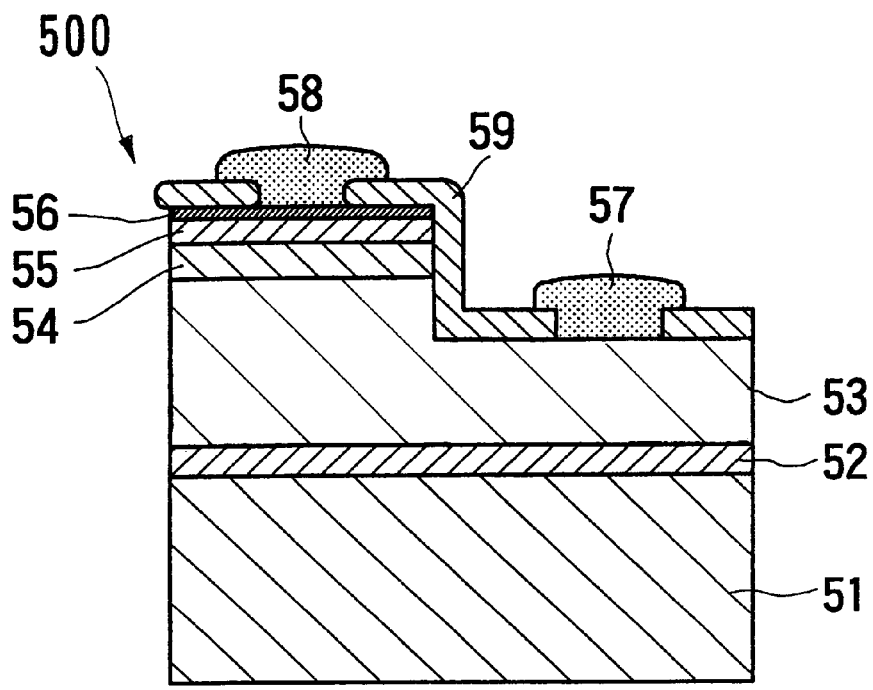
FIG. 5 shows a cross-sectional view showing a second embodiment of the semiconductor light emitting device according to the present invention.

FIG. 5 shows a cross-sectional view showing the second embodiment of the light emitting device according to the present invention, in which a semiconductor laser 500 is shown by way of example.

The semiconductor laser has a sapphire substrate 51, on which a GaN buffer layer 52, a Si-doped n-type GaN layer 53, an undoped InGaN layer 54, a Mg-doped p-type GaN layer 55, and a contact layer 56 are grown in this sequence. An n-side electrode 57 is formed on the n-type GaN layer 53, and a p-side electrode 58 is formed on the contact layer 56. Both the electrodes 57 and 58 are of laminated structure of nickel (N) and gold (Au). A $SiO_2$ film 59 is used to obtain a stripe structure of each of these electrodes 57 and 58.

The method of manufacturing the above-mentioned semiconductor laser will be described hereinbelow. This semiconductor laser was grown in accordance with the metal-organic chemical vapor deposition (MOCVD) method. In more detail, first after the sapphire substrate 51 having a (0001) surface had been washed by an organic solvent and acid, the substrate 51 was mounted on a heating susceptor disposed in a reaction chamber of an MOCVD instrument (not shown) to further clean the surface of the substrate 51 by use of high temperature hydrogen at 1200° C. The flow rate of the hydrogen was 5 liter (L) per minute. After that, the substrate 51 was cooled down to 500° C. At this temperature, the GaN buffer layer 52 was grown while supplying hydrogen at 15 L/min, nitrogen at 5 L/min, ammonia at 10 L/min, and trimethyl gallium (TMG) at 25 cc/min all for 10 minutes. Further, the sapphire substrate 51 was heated up to 1100° C. At this temperature, the n-type GaN layer 53 was grown while supplying hydrogen at 15

L/min, nitrogen at 5 L/min, ammonia at 10 L/min, trimethyl gallium (TMG) at 25 cc/min, and SiH$_4$ at 10 cc/min all for one hour.

Further, the sapphire substrate 51 was cooled down to 800° C. At this temperature, the undoped InGaN layer 54 was grown while supplying hydrogen at 5 L/min, nitrogen at 15 L/min, ammonia at 10 L/min, trimethyl gallium (TMG) at 3 cc/min, and trimethyl indium (TMI) at 300 cc/min all for about 15 minutes.

Further, the sapphire substrate 51 was heated up to 1100° C. again. At this temperature, the p-type GaN layer 55 was grown while supplying hydrogen at 15 L/min, nitrogen at 5 L/min, ammonia at 10 L/min, trimethyl gallium (TMG) at 25 cc/min, and dicyclopenta magnesium (Cp2Mg) at 30 cc/min all for about 30 minutes.

Further, while keeping the sapphire substrate 51 at 1100° C., the contact layer 56 with a thickness of about 10 nm was grown while supplying hydrogen at 15 L/min, nitrogen at 5 L/min, ammonia at 1 L/min, trimethyl gallium (TMG) at 25 cc/min, and dicyclopenta magnesium (Cp2Mg) at 30 cc/min all for about 3 minutes. After that, the furnace temperature was lowered down to the room temperature. When the p-type GaN contact layer 56 was formed as described above in such a way that the flow rate of the ammonia was reduced down to 1/10 in comparison with that used when the p-type GaN layer 55 was formed, it is possible to obtain the ptype GaN contact layer 56 in which Ga is excessive offset away from the stoichiometric composition.

The sapphire substrate 51 on which the above-mentioned nitride semiconductor laminated structure has been formed was taken out of the MOCVD instrument, the upper layer of the substrate 51 was partially etched until the n-type GaN layer 53 was exposed by reactive ion etching (RIE) method using Cl$_2$ by use of a SiO$_2$ film formed by the well-known thermal CVD method as a mask. Here, this formed SiO$_2$ film was also utilized as an insulating film 59. Further, on the stepped lamination structure manufactured as described above, a laminated structure composed of a Ni film with a thickness of 200 nm and an Au film with a thickness of 500 nm was formed. After that, the two ohmic electrodes 57 and 58 were obtained by a heat treatment at 700° C. for 5 min within nitrogen atmosphere.

The device 500 manufactured as described above can oscillate at a threshold current 3 KA/cm$^2$ in the wavelength of 420 nm.

3rd Embodiment

Figure 6:
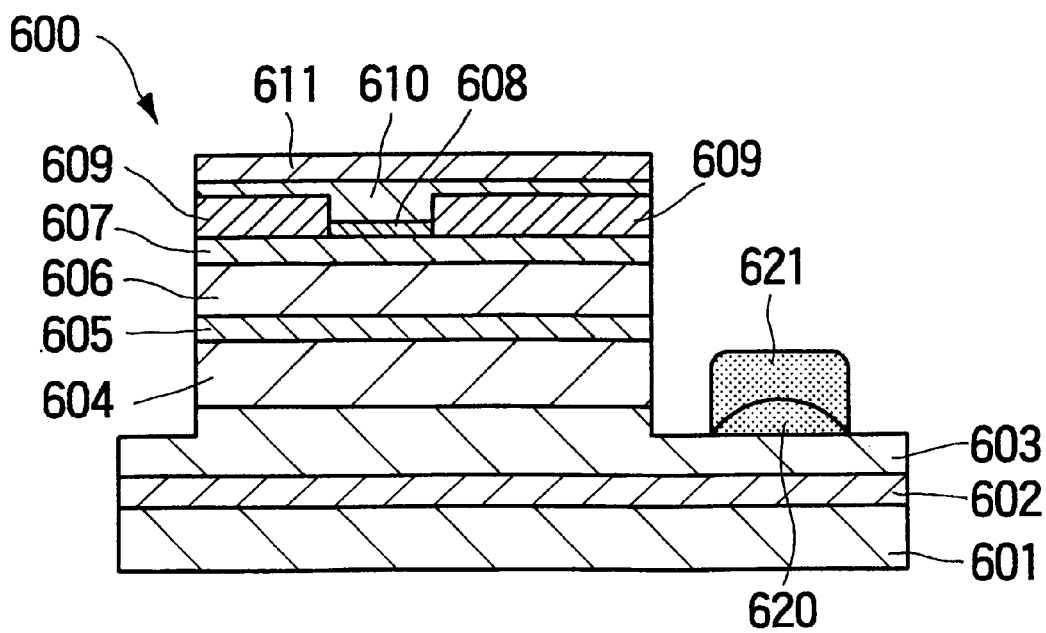
FIG. 6 shows a cross-sectional view showing a third embodiment of the semiconductor light emitting device according to the present invention.

FIG. 6 is shows a cross-sectional view showing the third embodiment of the light emitting device according to the present invention, in which a light emitting device 600 is shown by way of example.

The light emitting device 600 has a sapphire substrate 601, on which a GaN buffer layer 602, an n-type GaN contact layer 603, an n-type AlGaN cladding layer 604, an InGaN active layer 605, a p-type AlGaN cladding layer 606, and a p-type GaN layer 607 are grown in sequence as a multi-layer structure. Further, a part of this multi-layer structure is etched in such a way that the surface of the n-type GaN contact layer 603 is exposed. On the exposed n-type GaN contact layer 603, an n-side electrode 620 is formed. Further, a p-side electrode 610 is formed on the p-side. Further, when the light emitting device as described above is constructed as a semiconductor laser, it is preferable to form a current-blocking layer 609 formed of SiO$_2$ just under the p-side electrode 610 and to inject electrons thereinto at a high density.

The crystal growth can be made by growing the GaN buffer layer 602, the n-type GaN contact layer 603 B(Si is doped; the carrier concentration is about 5×10$^{18}$cm$^{-3}$; and the layer thickness is about 2 $\mu$m), the n-type AlGaN clad layer 604 (Si is doped; the carrier concentration is about 5×10$^{17}$cm$^{-3}$; and the layer thickness is about 0.5 $\mu$m), the GaN active layer 605 (undoped; the layer thickness is about 0.1 $\mu$m), the p-type AlGaN clad layer 606 (Mg is doped; the carrier concentration is about 5×10$^{17}$cm$^{-3}$; and the layer thickness is about 0.5 $\mu$m), and the p-type GaN layer 607 (Mg is doped; the carrier concentration is about 5×10$^{18}$cm$^{-3}$; and the layer thickness is about 2 $\mu$m), in sequence all on the sapphire substrate 601.

Further, in this third embodiment, a p-type GaN gallium-excessive contact layer 608 (in which Ga is contained excessively in such a way as to be offset away from the stoichiometric composition) with a thickness of about 0.05 $\mu$m is formed on the p-type GaN layer 607. In practice, when the crystal growth is made in accordance with the MOCVD method, the ratio in supply quantity of the gallium source material and the nitrogen source material is determined to be about 10 times larger than that used when the other layers are grown. As a result, in the gallium-excessive contact layer 608, the composition ratio of Ga/N is about 1.001, having an offset away from the stoichiometric composition.

By forming the contact layer 608 as described above, an excellent ohmic contact can be obtained at the contact portion of the p-side electrode 610. Here, the reason why the ohmic characteristics of the contact portion can be improved is considered to be due to the fact that the Schottky barrier formed between the semiconductor layer and the metallic layer can be reduced owing to the existence of the gallium-excessive contact layer 608.

In the laminated structure grown as described above, the n-type contact layer 603 is exposed by dry etching method, and further the p-side electrode 610 and the n-side electrode 620 are both formed by vacuum deposition method. Further, two electrode pads 611 and 621 for wire bonding are formed by vacuum-depositing gold (Au) on these electrodes, respectively.

As the result of the trial manufacturing by the Inventors, in the light emitting device of this third embodiment, laser oscillation can be attained at as low a voltage as about 3.6 V in comparison with the conventional light emitting device by which a driving voltage of about 5 V or higher is so far necessary for laser oscillation. In summary, in the light emitting device according to the present invention, since the gallium-excessive contact layer 608 is formed on the surface of the p-type contact layer 607, it is possible to secure an ohmic contact with the electrode 610, so that the contact resistance between the contact layer 607 and the electrode 610 can be reduced. As a result, since the generation of heat can be suppressed at this contact portion, it is possible to reduce the threshold voltage required for laser oscillation. Further, since the heat generation of the element can be suppressed, it is possible to lengthen the lifetime of the device and further to enable a stable operation for a long time period.

4th Embodiment

Figure 7:
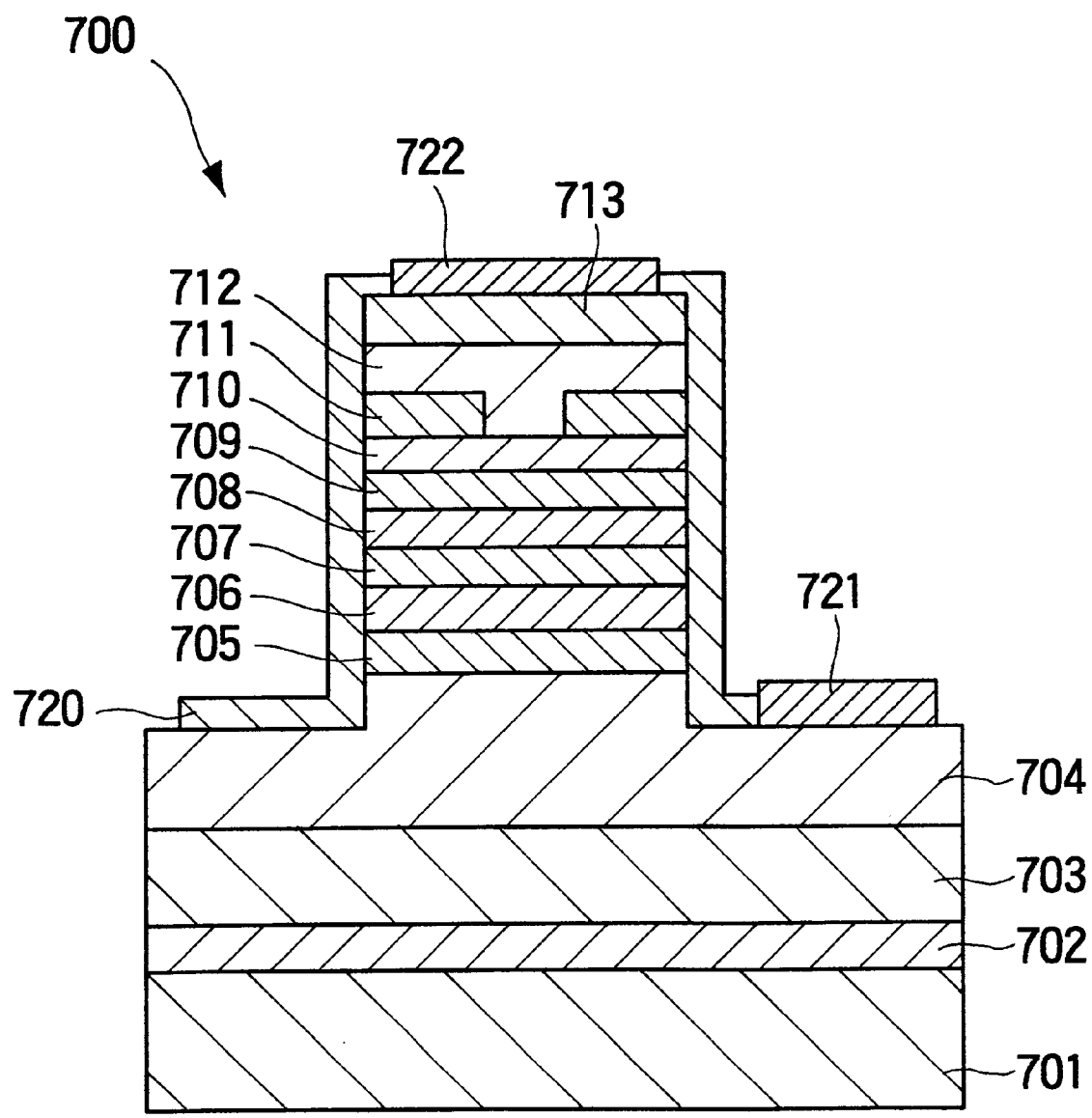
FIG. 7 shows a cross-sectional view showing a fourth through a eighth embodiments of the semiconductor light emitting device according to the present invention.

FIG. 7 shows a cross-sectional view showing the fourth embodiment of the light emitting device according to the present invention, in which a light emitting device 700 is shown by way of example.

The light emitting device 700 is a GaN based semiconductor laser of internal current-blocking structure, on which two buffer layers 702 and 703, an n-type contact layer 704, an n-type cladding layer 705, an n-type guiding layer 706, an active layer 707, a p-type guiding layer 708, a p-type cladding layer 709, a p-type layer 710, an n-type current-blocking layer 711, a p-type layer 712, and a gallium-excessive layer 713 are grown in sequence on a substrate 701 as a multi-layer structure.

In the semiconductor laser 700 of this fourth embodiment, the current-blocking characteristics of the n-type current-blocking layer 711 and the p-side electrode contact can be both improved, with the result that it is possible to improve the light emitting characteristics.

The manufacturing process of the semiconductor laser 700 will be described hereinbelow.

First, the sapphire substrate 701 is processed by organic washing and acid washing. The cleaned substrate 701 is introduced into a reaction chamber of an MOCVD instrument, and then mounted on the susceptor heated by a high frequency induction method.

Further, the substrate 701 is vapor-etched at about 1100° C. for about 10 minutes while supplying hydrogen at a flow rate of 10 L/min under the atmospheric pressure, to remove a natural oxide layer already formed on the surface of the substrate 701.

Further, the sapphire substrate 701 is cooled down to about 530° C. At this temperature, the GaN layer 702 with a thickness of about 50 nm is formed while supplying hydrogen at 15 L/min, nitrogen at 5 L/min, ammonia at 10 L/min, and trimethyl gallium (TMG) at 25 cc/min all for 4 minutes.

Further, the sapphire substrate 701 is heated up to 1100° C. while supplying hydrogen at 15 L/min, nitrogen at 5 L/min, and ammonia at 10 L/min. Further, at this temperature, the n-type undoped GaN layer 703 with a thickness of about 2 $\mu$m is formed while supplying hydrogen at 15 L/min, nitrogen at 5 L/min, ammonia at 10 L/min, and trimethyl gallium (TMG) at 100 cc/min all for about 60 minutes.

Further, the n-type GaN contact layer 704 with a thickness of about 4 $\mu$m is formed while supplying SiH$_4$ diluted to 10 ppm by hydrogen added to these source material gases at a flow rate of 3 cc/min for about 130 minutes.

Further, the n-type AlGaN cladding layer 705 with a thickness of about 0.2 $\mu$m is formed while supplying the source material gases to which TMA is added at a flow rate of 50 cc/min for about 10 minutes. Here, the composition ratio of Al is about 0.15.

Further, the sapphire substrate 701 is kept at 1100° C. At this temperature, the GaN guiding layer 706 with a thickness of about 0.1 $\mu$m is formed while supplying hydrogen at 15 L/min, nitrogen at 5 L/min, ammonia at 10 L/min, and trimethyl gallium (TMG) at 100 cc/min all for about 3 minutes. Here, since the guiding layer 706 is formed to improve the optical confinement effect, it is preferable to add indium (In) slightly. In this case, however, it is necessary to adjust the layer thickness according to the quantity of the added indium.

Further, the sapphire substrate 701 is cooled down to about 800° C. while supplying nitrogen at about 20 L/min and ammonia at 10 L/min for about 3 minutes. Further, at this temperature, the flow rate of nitrogen is fixed at about 20 L/min; that of ammonia is fixed at about 10 L/min; and that of TMG is fixed at about 10 cc/min, respectively. On the other hand, the flow rate of TMI is periodically changed between 50 cc/min for about one minute and 460 cc/min for about 30 sec, respectively. The above-mentioned combinations of the respective substances and the flow rates are repeated by 15 times. Finally, TMI is supplied at 50 cc/min for about 3 min. By the above-mentioned combination process, it is possible to form the active layer 707 of multi-quantum well (MQW) structure of 15-periodicity including a barrier layer with an indium composition of 5% and with a film thickness of 4 nm and a well layer with an indium composition of 20% and with a film thickness of 2 nm.

In this embodiment, although the InGaN layer having two indium compositions of 5% and 20% are used, respectively, since it is necessary that the energy band gap of the barrier layers are larger than that of the well layers, it is possible to use GaN layers or AlGaN layers as the barrier layers. In this case, however, as the two guiding layers 706 and 708, it is necessary to use a material whose refractive index is smaller than the average refractive index of the active layer. For instance, in the case where the barrier layers are formed by the GaN layers and further the well layers are formed by the InGaN layers with an indium composition ratio of 20% (the thickness is the same in both layers), the guiding layer can be formed by an InGaN layer with an indium composition ratio less than 10%, a GaN layer or an AlGaN layer. In this case, however, it is necessary that the indium composition ratio of the guiding layer must be smaller than that of the cladding layer.

Further, the sapphire substrate 701 is heated up to about 1100° C. for about 3 minutes while supplying nitrogen at about 20 L/min and ammonia at 10 L/min. At this temperature, the p-type GaN guiding layer 708 with a thickness of 0.1 $\mu$m is formed while supplying hydrogen at 15 L/min, nitrogen at about 5 L/min, ammonia at 10 L/min, TMG at 100 cc/min, and Cp2Mg at 50 cc/min for about 3 min.

Further, the p-type AlGaN cladding layer 709 with a thickness of 0.2 $\mu$m is formed while supplying the source material gases to which TMA is added at 50 cc/min for about 10 min.

After that, the supply of TMA is stopped. Further, the p-type GaN layer 710 with a thickness of about 0.5 $\mu$m is formed while supplying the remaining source material gases for about 15 min.

Successively, the supply of Cp2Mg is stopped. The ntype GaN layer 711 with a thickness of 1 $\mu$m is formed by adding SiH$_4$ to the source material gases at a flow rate of 3 cc/min. In this case, the ratio of Ga to N is as follows: the flow rate of Ga source material is increased up to 10 times and that of N source material is decreased down to 1/10 times, in comparison with when the n-type GaN layer 702 is formed. In other words, ammonia is supplied at a flow rate of 1 L/min, and TMG is supplied at a flow rate of 250 cc/min. As described above, when the Group-III element is supplied excessively, it is possible to form the n-type GaN layer 711 containing gallium excessively. The n-type GaN layer 711 formed as described above is provided with excellent current-blocking characteristics.

After that, the substrate is cooled down to 350° C. on condition that the supplies of TMG and SiH, are both kept stopped. Further, the supplies of hydrogen and ammonia are both stopped at 350° C. Under these conditions, the substrate is cooled down to the room temperature, and then the obtained wafer is taken out of the reaction chamber.

After that, a part of the n-type GaN layer 711 is partially masked with a SiO$_2$ film deposited on the obtained wafer in accordance with thermal CVD method and a photoresist, then the wafer is etched using of $Cl_2$ gas until the p-type GaN layer 710 can be exposed. At this process, the stripe width is 5 μm, for instance.

Further, the wafer thus processed is returned onto the susceptor within the MOCVD instrument, and the substrate is heated up to 1100° C. while supplying hydrogen at 15 L/min, nitrogen at 5 L/min, and ammonia at 10 L/min. Further, at this temperature, the p-type GaN layer 713 with a thickness of about 2 μm is formed while supplying hydrogen at 15 L/min, nitrogen at 5 L/min, ammonia at 10 L/min, TMG at 100 cc/min, and Cp2Mg at 50 cc/min all for about 60 minutes.

Further, the substrate is cooled down to 550° C. while supplying nitrogen at about 20 L/min, and ammonia at 10 L/min for about 3 minutes. Further, at this temperature, the p-type GaN layer with a thickness of about 50 nm is formed while supplying hydrogen at 15 L/min, nitrogen at 5 L/min, ammonia at 10 L/min, TMG at 500 cc/min, and Cp2Mg at 50 cc/min all for about 4 minutes. The GaN layer formed immediately after the above-mentioned process has a poly-crystalline structure having a preferred orientation at its c-axis. Since the poly-crystalline structure of this type has a fairly larger surface area compared to the usual single crystalline layers, it is provided with such an advantage that the contact resistance with an electrode formed thereon can be easily reduced. Without being limited only to the above-mentioned poly-crystalline structure grown at a low temperature as with the case of this embodiment, it is also possible to obtain a single-crystalline GaN layer on the basis of epitaxial growth at the ordinary growth temperature of about 1100° C.

Further, the $SiO_2$ film 720 with a thickness of about 0.5 μm is deposited on the p-type GaN layer 713 in accordance with the well-known thermal CVD method, and then a part of the deposited $SiO_2$ film is removed by photo-etching process. Further, the respective crystal layers are etched, until the n-type GaN layer 704 can be exposed, by reactive ion etching method using chlorine gas with the use of this $SiO_2$ film 720 and the resist film used as the photo-etching mask as masks.

Successively, a laminated structure of a Ti film with a thickness of 50 nm and an Au film with a thickness of 0.5 μm is formed on a part of the n-type GaN layer 704 by use of the well-known vacuum vapor deposition or a spattering method. Further, an n-type electrode 721 is formed by heat treatment at 450° C. for about 30 sec within nitrogen atmosphere.

After that, a p-type electrode 722 is formed by depositing a Pt layer with a thickness of about 10 nm, a Ti layer with a thickness of 50 nm, a Pt layer with a thickness of about 30 nm, and an Au layer with a thickness of 1 μm in this sequence all over the surface of the n-type GaN layer 713 by use of the well-known vacuum vapor deposition or a spattering method. Further, the laminated p-type electrode 722 is heat-treated at 300° C. for about 30 sec within nitrogen atmosphere. In the above-mentioned description, although the lamination structure of Pt/Ti/Pt/Au is adopted, it is also possible to adopt a single layer, a multi-layer structure, or an allow layer by use of other metals such as Al, Ag, Ni, Cr, Mg, Si, Zn, Be, Ge, In, Pd, Sn, etc. In order to increase the adhesion of wirebonding, electrode pads are formed by laminating a Cr layer with a thickness of about 5 nm and an Au layer with a thickness of about 1 μm in this sequence on these two electrodes 721 and 722 formed as described above, respectively. Au wires (not shown) are bonded to these pads respectively to secure electric contacts with the formed device.

With respect to the device formed with these electrodes 721 and 722, the lower surface of the sapphire substrate 701 (i.e., the surface opposite to that on which the device is formed) is polished to obtain an device thickness less than 60 μm. Further, lines are scribed on the lower surface of the substrate, and then cleaved into individual devices each having a size of about 500 μm×1 mm. In this case, the laser emission surface is decided on the A-plane, that is, on (11–20) plane of the GaN based material. After that, it is preferable to form a multi-layer reflective film formed of $SiO_2$ and $TiO_2$ on the laser emission surface in order to improve the reflection factor on the laser emission surface.

As a result of the trial by the Inventors, the semiconductor laser 700 can oscillate continuously at the room temperature at a threshold current density of 3 $kA/cm^2$. This indicates that the semiconductor laser according to the present invention can oscillate at an extremely low current density, as compared with the conventional laser whose threshold current density is 3.8 $kA/cm^2$ at the minimum. The reason why such a low threshold current density as described above can be realized may be due to the fact that since the n-type GaN current-blocking layer 711 is formed as a gallium-excessive layer, the activity coefficient of the n-type dopant can be improved, so that an effective current-blocking structure can be attained without producing current leakage. Further, in the present invention, since the p-type contact layer 713 is also formed as a gallium-excessive layer, the contact resistance with the electrode 722 can be also reduced and thereby the heat generation can be reduced at this contact portion, thus contributing to a reduction of the threshold current density.

Further, since the oscillation wavelength of the semiconductor laser according to the present invention is dependent upon the averaged indium composition of the active layer 707, it is possible to oscillate the laser at the wavelength between 390 nm and 450 nm.

5th Embodiment

The fifth embodiment of the light emitting device according to the present invention will be described hereinbelow with reference to FIG. 7. In the following description, the same description as with the case of the fourth embodiment will be omitted.

In this fifth embodiment, the n-type GaN current-blocking layer 711 shown in FIG. 7 is doped by lithium (Li) of the Group-I element. One of this doping method is to mix an appropriate amount of tertiary butyl lithium in the aforementioned crystal growth process. When lithium is doped, the resistance of the current- blocking layer 711 formed as the gallium-excessive layer can be increased, so that it is possible to obtain an excellent current-blocking effect. As the result of the trial by the Inventors, the fabricated laser device can be oscillated at 5 V. Further, even when the sodium (Na) or kalium (K) of the same Group-I element is doped instead of lithium (Li), the resistance of the current-blocking layer 711 can be increased, so that it is possible to obtain the same effect as with the case of Li.

6th Embodiment

The sixth embodiment of the light emitting device according to the present invention will be described hereinbelow with reference to FIG. 7.

In this sixth embodiment, the n-type GaN current blocking layer 711 shown in FIG. 7 is doped by nickel (Ni) of the transition metal. When nickel is doped as described above, the resistance of the current-blocking layer 711 formed as the gallium-excessive layer can be increased, so that it is possible to obtain an excellent current-blocking effect. As the transition metals which can be doped to the current-blocking layer 711, iron (Fe), chromium (Cr), cobalt (Co), titanium (Ti), platinum (Pt), gold (Au), silver (Ag), etc. are also advantageous in the present invention.

Further, when a layer having a thickness of about 1 nm in which not only magnesium (Mg) but also nickel (Ni) are added is formed on the surface of the p-type contact layer 713, it is possible to reduce the contact resistance by about 10% between the contact layer 713 and the p-side electrode 722. The reason why the contact resistance can be reduced may be due to the fact that since nickel is introduced, the contact layer 713 is easily alloyed with the p-side electrode 722 more effectively. The same effect as above can be obtained by introducing any metal constituting the p-side electrode 722 into the surface layer of the p-type contact layer 713.

7th Embodiment

The seventh embodiment of the light emitting device according to the present invention will be described hereinbelow with reference to FIG. 7.

In this seventh embodiment, the n-type GaN current-blocking layer 711 shown in FIG. 7 is doped by chlorine (Cl) of the Group-VII element. One of this doping method is to mix an appropriate amount of butyl chlorine in the afore-mentioned crystal growth process. When chlorine is doped, the resistance of the formed current-blocking layer 711 can be increased, so that it is possible to obtain an excellent current-blocking effect. Further, even when fluorine (F), bromine (Br) or iodine (I) is doped instead of chlorine (Cl), the resistance of the current-blocking layer 711 can be increased in the same way, so that it is possible to obtain the same effect as with the case of chlorine.

8th Embodiment

The eighth embodiment of the light emitting device according to the present invention will be described hereinbelow with reference to FIG. 7.

In this eighth embodiment, the n-type contact layer 704 is different from that of the fourth embodiment. In more detail, in the afore-mentioned crystal growth process, after the sapphire substrate 701 is heated up to 1100° C. while supplying hydrogen at 15 L/min, nitrogen at 5 L/min, and ammonia at 10 L/min, the undoped GaN layer 703 with a thickness of about 2 μm is formed while supplying hydrogen at 15 L/min, nitrogen at 5 L/min, ammonia at 10 L/min, and TMG at 100 cc/min for about 60 minutes. In the afore-mentioned fourth embodiment, the n-type contact layer 704 is formed by further adding $SiH_4$ diluted to 10 ppm by hydrogen to these source materials. In this eighth embodiment, however, the n-type GaN layer 704 with a thickness of about 4 μm is formed by changing the flow rate of ammonium to 1 L/min (changed from 10 L/min) and the flow rate of TMG to 1000 cc/min (changed from 100 cc/min), respectively and by supplying these for about 130 minutes. As a result of this procedure, the resistance of the n-side contact can be reduced down to about 70% of the conventional value. In other words, since the n-type contact layer 704 is constructed as gallium-excessive layer, the contact resistance can be reduced. The reason why the contact can be improved may be due to the fact that the Schottky barrier height relative to the n-side electrode can be reduced.

9th Embodiment

Figure 8:
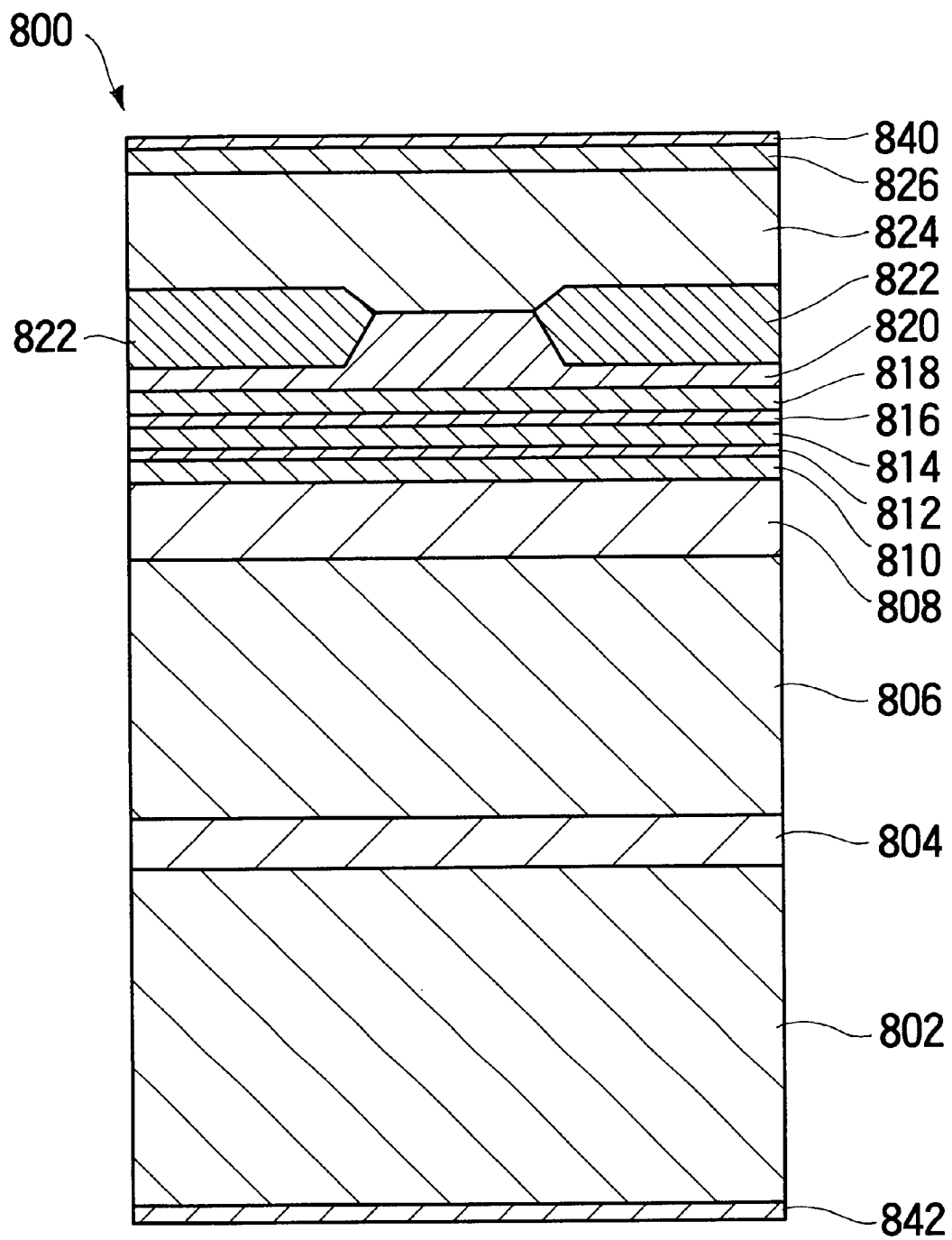
FIG. 8 shows a cross-sectional view showing a ninth embodiment of the semiconductor light emitting device according to the present invention.

The ninth embodiment of the light emitting device according to the present invention will be described hereinbelow with reference to the attached drawing. FIG. 8 shows a cross-sectional view showing the same device diagrammatically. The light emitting device according to this embodiment is a gallium nitride based semiconductor laser of an internal current-blocking structure formed on an n-type SiC substrate. In more detail, a semiconductor laser 800 is of multi-layer structure, which can be obtained by growing an n-type buffer layer 804, an n-type current diffusion layer 806, an n-type cladding layer 808, an n-type guiding layer 810, an n-type overflow prevention layer 812, an active layer 814, a p-type overflow prevention layer 816, a p-type guiding layer 818, a p-type cladding layer 820, a current-blocking layer 822, a p-type current diffusion layer 824, and a p-type contact layer 826 in sequence on an n-type SiC substrate 802. Further, a p-side electrode 840 is formed on the p-type contact layer 826, and an n-side electrode 842 is formed on the reverse surface of the SiC substrate 802.

Each of these layers functions as follows:

The n-type buffer layer 804 serves to accommodate the lattice distortion each produced between the SiC substrate 802 and each layer of the gallium nitride based semiconductor, and also reduce the discontinuity of the band gaps therebetween.

The n-type current diffusion layer 806 and the p-type current diffusion layer 824 serve to diffuse the injected current flowing into the device and further narrowed by the current-blocking layer 822 to all over the n-side electrode 842 and the p-side electrode 840, respectively.

The n-type cladding layer 808 and the p-type cladding layer 820 serve to confine the light and injected carriers in the active layer 814, respectively.

The n-type guide layer 810 and the p-type guiding layer 818 serve to guide the light waves emitted by the active layer 814 along the resonator, respectively and thereby to facilitate the laser oscillation.

The n-type overflow prevention layer 812 and the p-type overflow prevention layer 816 serve to prevent the carriers injected into the active layer 814 from being overflowed to both the outside layers, respectively The active layer 814 servers as the light emitting layer to generate light on the basis of the recombination of the injected carriers.

The current-blocking layer 822 serves to narrow the current flowing into the active layer 814 and thereby to increase the current density thereof, so that the laser oscillation can be facilitated.

The p-type contact layer 826 servers to secure the ohmic contact with the p-side electrode 840 and thereby to reduce the contact resistance between the two.

The above-mentioned respective layers can be formed in the gallium nitride based semiconductor by selecting each composition of these layers appropriately.

Here, the feature of the present invention is to form the n-type buffer layer 804, the current-blocking layer 822 and the p-type contact layer 826 in such a way that each composition thereof is offset away from its stoichiometric composition.

In more detail, as the material of the buffer layer 804, n-type GaN containing the Group-V element excessively or n-type InGaAlN containing the Group-III element excessively can be selected, for instance. When the buffer layer 804 is constructed as a non-stiochiometric compound layer of non-stoichiometric composition, it is possible to buffer the lattice distortion generated between the SiC substrate 802 and each of the respective layers grown on the same substrate, so that the electric contact can be improved markedly. In other words, since the lattice constant of the SiC substrate 802 is different from those of the respective layers 806 to 820 of the gallium nitride based semiconductor, respectively, some lattice distortions are inevitably produced between the substrate and each of the respective layers. In this case, however, when the buffer layer is constructed in such a way that the lattice distortion of the buffer layer can be roughly equalized to the absolute total amount of the lattice distortions of the respective layers but opposite to each other in the direction (sign) thereof, it is possible to cancel the lattice distortions applied to the respective layers 806 to 820 of the gallium nitride based semiconductor by the lattice distortion of the buffer layer 804. Here, the amount and the direction of the lattice distortion can be controlled by adjusting the offset amount of the buffer layer 804 from the stoichiometric composition.

In addition, when the buffer layer 804 is formed by use of a material of non-stoichiometric composition, it is also possible to lighten the discontinuity of the band gaps between the SiC substrate 802 and the respective layers of the gallium nitride based semiconductor, so that the electric contact thereof can be improved; the drive voltage of the light emitting device can be reduced; and the heat generated by the device can be suppressed. As a result, it is possible to improve the light emission characteristics of the light emitting device.

Further, as the material of the current-blocking layer 822, n-type GaN containing the Group-V element excessively or n-type InGaAlN containing the Group-III element excessively can be selected, for instance. When the above-mentioned material of non-stoichiometric composition is selected, it is possible to improve the current-blocking characteristics markedly and thereby to realize an effective current-blocking function. In other words, since the material of the non-stoichiometric composition can realize an n-type layer of high concentration, the current-blocking characteristics can be improved markedly.

As the alternative material of the current-blocking layer 822, the material of non-stoichiometric composition having a high resistivity can be adopted. In more detail, when AlN material containing the Group-III element or the Group-V element excessively is selected, since a high resistivity can be easily obtained, it is possible to improve the current-blocking characteristics markedly. Further, when an appropriate amount of impurities of a transition metal element is doped, it is possible to further increase the resistivity thereof.

On the other hand, when the material of non-stoichiometric composition is used as the current-blocking layer 822, it is possible to cancel the lattice distortions applied to the respective layers 806 to 820 due to difference in lattice constant between the SiC substrate 802 and each of the respective layers 806 to 820 of the gallium nitride semiconductor.

Further, as the material of the p-type contact layer 826, a p-type GaN containing the Group-III element excessively or a p-type GaN containing the Group-V element excessively can be selected, for instance. Since these materials can realize the p-type layer of high concentration, it is possible to secure the ohmic contact with the p-side electrode 840, so that the contact resistance can be reduced markedly. As a result, it is possible to reduce the drive voltage of the light emitting device and thereby to reduce the heat generated by the device, with the result that the light emission characteristics of the light emitting device can be improved.

Further, in this ninth embodiment, since a conductive SiC substrate is used as the substrate 802, the n-side electrode 842 can be formed on the reverse surface of the substrate 802. As a result, the device characteristics can be improved, while simplifying the device structure and thereby reducing the device area. In practice, when the insulating substrate as shown in FIG. 7, since the n-side electrode and the p-side electrode must be formed on the same surface side of the device, there exists a problem in that the current leaks easily between the two electrodes and further the breakdown voltage of the device is also lowered. In contrast with this, in this embodiment, since the p-side electrode 840 and the n-side electrode 842 can be formed so as to be opposed to each other, it is possible to suppress the current leak and thereby to improve the breakdown voltage thereof markedly. As a result, it is possible to generate laser oscillation easily by applying the drive current effectively, without producing a current leakage.

Further, the SiC substrate 802 is much readily cleaved in comparison with the sapphire substrate. Therefore, in this embodiment, it is possible to easily form the cavity mirror surface required for laser oscillation by the cleavage process.

Further, in this embodiment, since the etching process for forming the n-type electrode is not necessary, being different from the device as shown in FIG. 7, the production yield can be improved. Further, since the p-side electrode and the n-side electrode can be formed on the two opposing surfaces, respectively, the device area can be reduced down to about half of that shown in FIG. 7, with the result that the manufacturing cost of the device can be reduced.

The practical materials of the respective layers of the light emitting device 800 are as follows:

As the substrate 802, an n-type 6H-SiC wafer can be used, for instance.

As the buffer layer 804, a $Ga_{0.9}Si_{0.1}$ N layer or an n-type InGaAlN layer containing the Group-III element or the Group-V element excessively can be used, for instance. Further, it is preferable that the thickness of the buffer layer 804 is about 0.5 $\mu$m to cancel the lattice distortion effectively.

As the current diffusion layers 806 and 824, an n-type GaN layer and a p-type GaN layer each having a thickness of about 0.5 $\mu$m can be used, for instance.

As the cladding layers 808 and 820, an n-type GaAlN layer and a p-type GaAlN layer each having a thickness of about 0.1 to 0.3 $\mu$m can be used, for instance.

As the guiding layers 810 and 818, an n-type GaN layer and a p-type GaN layer each having a thickness of about 0.1 $\mu$m can be used, for instance.

As the overflow prevention layers 812 and 816, an n-type GaAlN layer and a p-type GaAlN layer each having a thickness about 20 nm can be used, for instance.

Further, as the active layer 814, a multi-quantum well (MQW) structure obtained by laminating GaN layers with a thickness of about 20 nm and GaAlN layers with a thickness of about 40 nm about five times (5-periodicity) can be used, for instance.

As the current-blocking layer 822, a $Ga_{0.9}Si_{0.1}N$ layer with a thickness of about 0.25 to 0.5 $\mu$m or an n-type InGaAlN layer offset away form the stoichiometric composition can be used, for instance. Or else, an n-type AlN layer offset away form the stoichiometric composition can be also used.

As the p-type contact layer 826, a GaN layer having a composition offset away from the stoichiometric composition and containing magnesium (Mg) can be used, for instance.

These semiconductor layers 804 to 826 can be formed by use of MOCVD method, for instance in the same way as with the case of the afore-mentioned embodiments. Here, when the non-stiochiometric compound layers 804, 822 and 826 each having a non-stoichiometric composition are formed, the supply ratio of the Group-III element to the Group-V element is decided less than 1/10 times or more than 10 times of that of the ordinary conditions, as already explained.

The embodiment of the present invention can provide a light emitting device low in oscillation threshold and long in lifetime.

10th Embodiment

Figure 9:
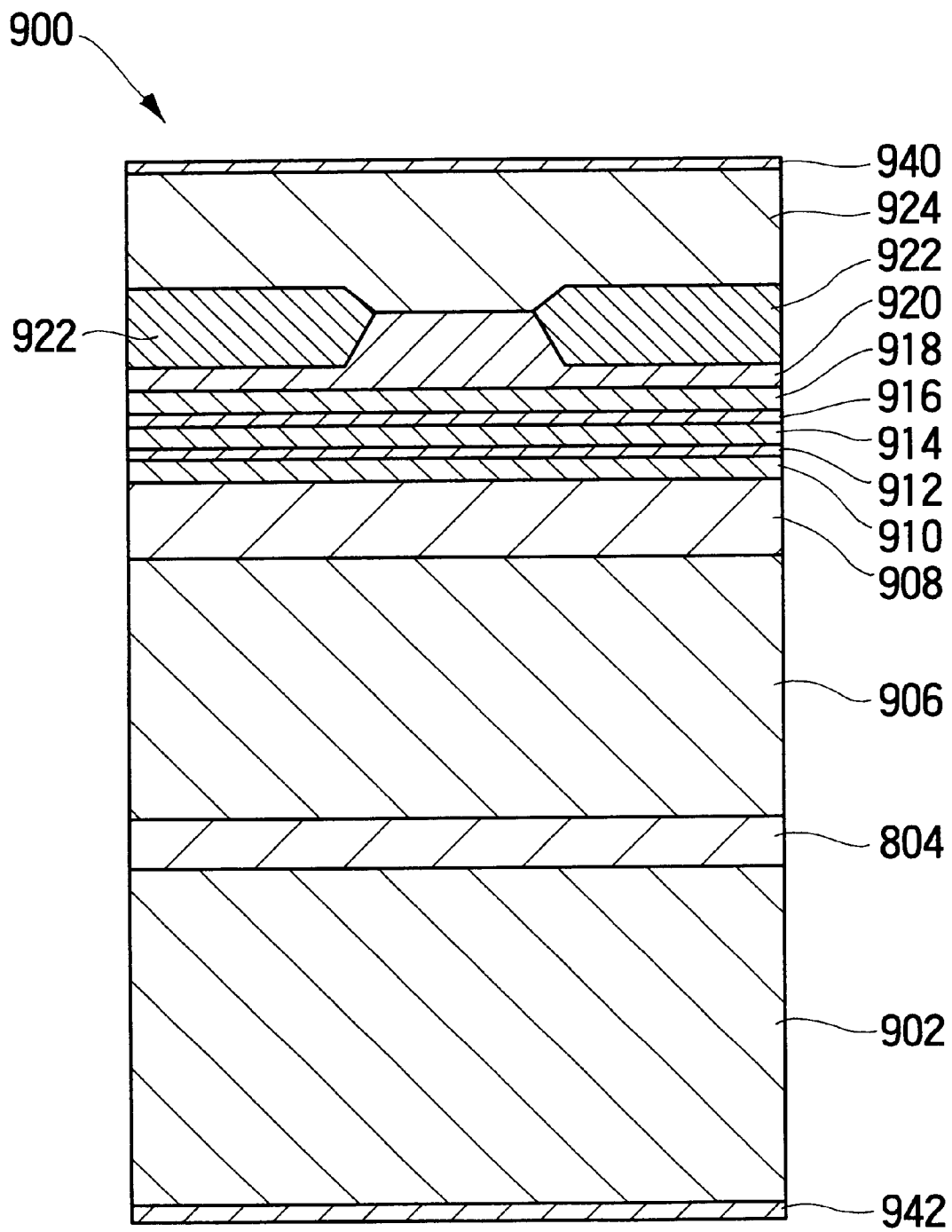
FIG. 9 shows a cross-sectional view showing a tenth embodiment of the semiconductor light emitting device according to the present invention.

The tenth embodiment of the light emitting device according to the present invention will be described hereinbelow with reference to the attached drawing. FIG. 9 shows a cross-sectional view showing the same device diagrammatically. The light emitting device according to this embodiment is a gallium nitride based semiconductor laser of an internal current-blocking structure formed on a p-type SiC substrate. In more detail, a semiconductor laser 900 is of multi-layer structure, which can be obtained by growing a p-type buffer layer 904, a p-type current diffusion layer 906, a p-type cladding layer 908, a p-type guiding layer 910, a p-type overflow prevention layer 912, an active layer 914, an n-type overflow prevention layer 916, an n-type guiding layer 918, an n-type cladding layer 920, a current-blocking layer 922, and an n-type contact layer 924 in sequence on a p-type SiC substrate 902. Further, an n-side electrode 940 is formed on the n-type contact layer 924, and a p-side electrode 942 is formed on the reverse surface of the SiC substrate 902.

The function of each of the above-mentioned layers is basically the same as with the case of the ninth embodiment.

Further, in this tenth embodiment, the p-type buffer layer 904 and the current-blocking layer 922 are formed in such a way that each composition thereof is offset away from its stoichiometric composition.

In more detail, as the material of the buffer layer 904, p-type GaN containing the Group-V element excessively or p-type InGaAlN containing the Group-III element excessively can be selected, for instance. When the buffer layer 904 is constructed as a non-stiochiometric compound layer of non-stoichiometric composition, it is possible to buffer the lattice distortion generated between the SiC substrate 902 and each of the respective layers laminated on the same substrate, so that the electric contact can be improved markedly. In other words, since the lattice constant of the SiC substrate 902 is different from those of the respective layers 906 to 920 of the gallium nitride based semiconductor, respectively, some lattice distortions are inevitably produced between the substrate and each of the respective layers. In this case, however, when the buffer layer is constructed in such a way that the lattice distortion of the buffer layer can be roughly equalized to the absolute total amount bi the lattice distortions of the respective layers but opposite to each other in the direction (sign) thereof, it is possible to cancel the lattice distortions applied to the respective layers 906 to 920 of the gallium nitride based semiconductor by the lattice distortion of the buffer layer 004. Here, the amount of and the direction of the lattice distortion of the buffer layer 904 can be controlled by adjusting the offset amount of the buffer layer 904 from the stoichiometric composition.

In addition, when the buffer layer 904 is formed by use of a material of non-stoichiometric composition, it is also possible to lighten the discontinuity of the band gaps between the SiC substrate 902 and the respective layers of the gallium nitride based semiconductor, so that the electric contact thereof can be improved; the drive voltage of the light emitting device can be reduced; and the heat generated by the device can be suppressed. As a result, it is possible to improve the light emission characteristics of the light emitting device.

Further, as the material of the current-blocking layer 922, p-type GaN containing the Group-V element excessively or p-type InGaAlN containing the Group-III element excessively can be selected, for instance. When the above-mentioned material of non-stoichiometric composition is selected, it is possible to improve the current-blocking characteristics markedly and thereby to realize an effective current-blocking function. In other words, since the material of the non-stoichiometric composition can realize a p-type layer of high concentration, the current-blocking characteristics can be improved markedly.

On the other hand, as the material of the current-blocking layer 922, it is possible to use a gallium nitride semiconductor of high resistivity, which contains the Group-III element or the Group-V element excessively. Further, when an appropriate amount of impurities of a transition metal element is contained, it is possible to further increase the resistivity thereof. When these materials are used, it is possible to easily obtain the current-blocking layer of a high resistivity and thereby to improve the current-blocking characteristics markedly.

Further, when the material of non-stoichiometric composition is used as the current-blocking layer 922, it is possible to reduce the lattice distortions applied to the respective layers 906 to 920 due to difference in lattice constant between the SiC substrate 902 and each of the respective layers 906 to 920 of the gallium nitride semiconductor.

Further, in this tenth embodiment, since a conductive SiC substrate is used as the substrate 902, the same effect as with the case of the ninth embodiment can be obtained. That is, since the n-side electrode 940 and the p-side electrode 942 can be formed so as to be opposed to each other, it is possible to improve the device characteristics, simplify the device structure and reduce the device area. In addition, the current leakage can be suppressed and therefore the breakdown voltage of the device can be improved markedly. As a result, it is possible to generate an effective oscillation easily by applying a large drive current.

Further, the SiC substrate 902 is much easy to be cleaved in comparison with the sapphire substrate. Therefore, in this embodiment, it is possible to easily form the cavity mirror surface required for laser oscillation by the cleavage process.

Further, in this embodiment, since the etching process for forming the n-type electrode is not necessary, being different from the device as shown in FIG. 7, the production yield can be improved. Further, since the p-side electrode and the n-side electrode can be formed on the two opposing surfaces, respectively, the device area can be reduced down to about half of that shown in FIG. 7, with the result that the manufacturing cost of the device can be reduced.

The practical materials of the respective layers of the light emitting device 900 are as follows:

As the substrate 902, an n-type 6H—SiC wafer can be used, for instance.

As the buffer layer 904, a $Ga_{0.9}Mg_{0.1}N$ layer or a p-type InGaAlN layer offset away from the stoichiometric composition can be used, for instance. Further, it is preferable that the thickness of the buffer layer 904 is about 0.5 μm to cancel the lattice distortion effectively.

As the current diffusion layer 906, a p-type GaN layer having a thickness of about 0.5 μm can be used, for instance.

As the cladding layers 908 and 920, a p-type GaAlN layer and an n-type GaAlN layer each having a thickness of about 0.1 to 0.3 μm can be used, for instance.

As the guiding layers 910 and 918, a p-type GaN layer and an n-type GaN layer each having a thickness of about 0.1 μm can be used, for instance.

As the overflow prevention layers 912 and 916, a p-type GaAlN layer and an n-type GaAlN layer each having a thickness about 20 nm can be used, for instance.

Further, as the active layer 914, a multi-quantum well (MQW) structure obtained by laminating a GaN layer with a thickness of about 20 nm and a GaAlN layer with a thickness of about 40 nm about five times (5-periodicity) can be used, for instance.

As the current-blocking layer 922, a $Ga_{0.9}Mg_{0.1}N$ layer with a thickness of about 0.25 to 0.5 μm or a p-type InGaAlN layer offset away form the stoichiometric composition can be used, for instance. Or else, an AlN layer having a high resistivity and offset away form the stoichiometric composition can be also used.

As the n-type contact layer 924, a GaN layer containing silicon can be used, for instance. Further, when material having a composition offset away from the stoichiometric composition is used, the contact resistance can be reduced.

These semiconductor layers 904 to 924 can be formed by use of MOCVD method, for instance in the same way as with the case of the afore-mentioned embodiments. Here, when the non-stiochiometric compound layers 904 and 922 each having a non-stoichiometric composition are formed, the supply ratio of the Group-III element to the Group-V element is decided less than 1/10 times or more than 10 times of that of the ordinary conditions, as already explained.

The embodiment of the present invention can provide a light emitting device low in oscillation threshold and long in lifetime.

Various embodiments of the light emitting device according to the present invention have been described hereinabove on the basis of the practical examples. However, it is to be understood that the present invention need not be limited only to the above-mentioned embodiments.

For instance, in the above-mentioned embodiments, the non-stiochiometric compound layer offset away from the stoichiometric composition is a gallium-excessive layer. Without being limited only thereto, the non-stiochiometric compound layer can be formed as a layer containing indium (In) or aluminum (Al) of the III Group element excessively, instead of gallium (Ga).

Further, in contrast with this, the non-stiochiometric compound layer can be formed as a layer containing nitrogen of the Group-V element excessively.

Further, the growth method of the compound semiconductor layer is not limited only to the metal-organic chemical deposition method. In other words, any crystal growth method can be adopted as far as the conditions during the crystal growth are offset away from the thermal equilibrium conditions (i.e., non equilibrium conditions). In addition, a hydride chemical vapor deposition method, a chemical beam epitaxy (CBE) method, a metal-organic molecular beam epitaxy (MOMBE) method, etc. can be also adopted. In other words, in the present invention, any growth methods can be adopted as far as the compound semiconductor layer whose composition is offset away from the stoichiometric conditions can be formed or grown.

Further, in the present invention, oxygen can be doped into GaN layer at high concentration. In other words, in the case of the GaN layer in which excessive Ga is contained and thereby the composition ratio is offset away from the stoichiometric composition, it is possible to allow the layer to contain a large amount of oxygen as compared with the conventional layer. As a result, the GaN layer can be easily etched by use of acid, so that there exists such an effect that the manufacturing process of the devices can be facilitated in comparison with the conventional process.

What is claimed is:

1. A semiconductor light emitting device, comprising:

a light emitting layer formed of a gallium nitride based semiconductor;

a non-stoichiometric compound layer formed of the gallium nitride based semiconductor having a composition offset away from a stoichiometric composition thereof; and at least one electrode, wherein said non-stoichiometric compound layer includes a compound layer satisfying the following condition:

$$(x_1+x_2+x_3) \neq y$$

in a composition formula expressed by:

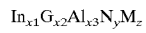

where M denotes an additive element to the gallium nitride based semiconductor and $x_1 \geq 0$, $x_2 \geq 0$, $x_3 \geq 0$, $y>0$, and $z \geq 0$, and said compound layer comprising at least one of a compound layer in which a quotient obtained by dividing an absolute value of $(x_1+x_2+x_3-y)$ by y is greater than 0.0001 and a compound layer in which a quotient obtained by dividing an absolute value of $(x_1+x_2+x_3-y-z)$ by $(y+z)$ is greater than 0.0001.

2. The semiconductor light emitting device of claim 1, wherein said non-stoichiometric compound layer is a semiconductor contact layer connected to said electrode.

3. The semiconductor light emitting device of claim 1, wherein said non-stoichiometric compound layer is a current blocking layer for narrowing current introduced into said light emitting layer.

4. The semiconductor light emitting device of claim 1, wherein the additive element M is an element selected from the group consisting of oxygen (O), sulfur (S), selenium (Se), and tellurium (Te) in the Group-VI elements.

5. The semiconductor light emitting device of claim 1, wherein the additive element c is an element selected from the group consisting of silicon (Si), carbon (C), and germanium (Ge) in the Group-IV elements.

6. The semiconductor light emitting device of claim 1, wherein the additive element M is an element selected from the group consisting of fluorine (F), chorine (Cl), bromine (Br), and indium (I) in the Group-VII elements.

7. The semiconductor light emitting device of claim 1, wherein the additive element M is an element selected from the group consisting of lithium (Li), sodium (Na), and potassium (K) in the Group-I elements.

8. The semiconductor light emitting device of claim 1, wherein the additive element M is an element selected from the group consisting of iron (Fe), chromium (Cr), nickel (Ni), cobalt (Co), titanium (Ti), platinum (Pt), gold (Au), and silver (Ag) in the transition metal elements.

9. A chalcogenide compound semiconductor light emitting device, comprising:

an n-type conductivity ZnSe substrate containing iodine;

a zinc-chalcogenide layer formed on said substrate and containing one of the Group-VII elements;

a first p-type conductivity ZnSe layer formed on said zinced chalcogenide layer and containing one of the Group-V elements;

a second p-type conductivity ZnSe layer formed on said first p-type conductivity ZnSe layer and having a zinc or selenium excessive layer containing one of the Group-V elements; and two electrodes formed on said second p-type conductivity ZnSe layer and said n-type conductivity ZnSe substrate, respectively.

10. A semiconductor light emitting device, comprising:

a first conductivity type SiC substrate;

a buffer layer formed on an upper surface of said SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a second conductivity type contact layer;

a first electrode formed on a lower surface of said SiC substrate; and a second electrode formed on said contact layer, wherein said buffer layer includes a non-stoichiometric compound layer formed of the gallium nitride based semiconductor having a composition offset away from a stoichiometric composition thereof, and said composition offset is defined such that a difference in a number between Group-III atoms and Group-V atoms of said gallium nitride based semiconductor is greater than a total number of impurity atoms incorporated in said gallium nitride based semiconductor.

11. A semiconductor light emitting device, comprising:

a first conductivity type SiC substrate;

a buffer layer formed on an upper surface of said SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a second conductivity type contact layer;

a first electrode formed on a lower surface of said SiC substrate; and a second electrode formed on said contact layer, wherein said buffer layer includes a non-stoichiometric compound layer formed of the gallium nitride based semiconductor having a composition offset away from a stoichiometric composition thereof, said non-stoichiometric compound layer includes a compound layer satisfying the following condition:

$$(x_1+x_2+x_3) \neq y$$

in a composition formula expressed by:

$$In_{x_1}Ga_{x_2}Al_{x_3}N_yM_z$$

where M denotes an additive element to the gallium nitride based semiconductor and $x_1 \geq 0$, $x_2 \geq 0$, $x_3 \geq 0$, $y > 0$, and $z \geq 0$, and said compound layer comprises at least one of a compound layer in which a quotient obtained by dividing an absolute value of $(x_1+x_2+x_3-y)$ by y is greater than 0.0001 and a compound layer in which a quotient obtained by dividing an absolute value of $(x_1+x_2+x_3-y-z)$ by $(y+z)$ is greater than 0.0001.

12. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a second conductivity type contact layer;

a first electrode formed on a reverse surface of said SiC substrate; and a second electrode formed on said contact layer, wherein said contact layer includes a non-stoichiometric compound layer formed of the gallium nitride based semiconductor having a composition offset away from a stoichiometric composition thereof, and said composition offset is defined such that a difference in a number between Group-III atoms and Group-V atoms of said gallium nitride based semiconductor is greater than a total number of impurity atoms incorporated in said gallium nitride based semiconductor.

13. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a second conductivity type contact layer;

a first electrode formed on a reverse surface of said SiC substrate; and a second electrode formed on said contact layer, wherein said contact layer includes a non-stoichiometric compound layer formed of the gallium nitride based semiconductor having a composition offset away from a stoichiomctric composition thereof, said non-stoichiometric compound layer includes a compound layer satisfying the following condition:

$$(x_1+x_2+x_3) \neq y$$

in a composition formula expressed by:

$$In_{x_1}Ga_{x_2}Al_{x_3}N_yM_z$$

where M denotes an additive element to the gallium nitride based semiconductor and $x_1 \geq 0$, $x_2 \geq 0$, $x_3 \geq 0$, $y > 0$, and $z \geq 0$, and said compound layer comprises at least one of a compound layer in which a quotient obtained by dividing an absolute value of $(x_1+x_2+x_3-y)$ by y is greater than 0.0001 and a compound layer in which a quotient obtained by dividing an absolute value of $(x_1+x_2+x_3-y-Z)$ by $(y+z)$ is greater than 0.0001.

14. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a first conductivity type current-blocking layer;

a second conductivity type contact layer;

a first electrode formed on a reverse surface of said SiC substrate; and a second electrode formed on said contact layer, wherein said current-blocking layer includes a non-stoichiometric compound layer formed of the gallium nitride based semiconductor having a composition offset away from a stoichiometric composition thereof, and said composition offset is defined such that a difference in a number between Group-III atoms and Group-V atoms of said gallium nitride based semiconductor is greater than a total number of impurity atoms incorporated in said gallium nitride based semiconductor.

15. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a first conductivity type current-blocking layer;

a second conductivity type contact layer;

a first electrode formed on a reverse surface of said SiC substrate; and a second electrode formed on said contact layer, wherein said current-blocking layer includes a non-stoichiometric compound layer formed of the gallium nitride based semiconductor having a composition offset away from a stoichiometric composition thereof, said non-stoichiometric compound layer includes a compound layer satisfying the following condition:

$$(x_1+x_2+x_3) \neq y$$

in a composition formula expressed by:

$$In_{x_1}Ga_{x_2}Al_{x_3}N_yM_z$$

where M denotes an additive element to the gallium nitride based semiconductor and $x_1 \geq 0$, $x_2 \geq 0$, $x_3 \geq 0$, $y > 0$, and $z \geq 0$, and said compound layer comprises at least one of a compound layer in which a quotient obtained by dividing an absolute value of $(x_1+x_2+x_3-y)$ by y is greater than 0.0001 and a compound layer in which a quotient obtained by dividing an absolute value of $(x_1+x_2+x_3-y-z)$ by $(y+z)$ is greater than 0.0001.

16. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a current-blocking layer of high resistivity;

a second conductivity type contact layer;

a first electrode formed on a reverse surface of said SiC substrate; and a second electrode formed on said contact layer, wherein said gallium nitride based semiconductor of said current-blocking layer has a composition offset away from a stoichiometric composition thereof, and said composition offset is defined such that a difference in a number between Group-III atoms and Group-V atoms of said gallium nitride based semiconductor is greater than a total number of impurity atoms incorporated in said gallium nitride based semiconductor.

17. A semiconductor light emitting device, comprising:

a first conductivity type SiC substrate;

a first conductivity type cladding layer formed of a gallium nitride based semiconductor;

a light emitting layer formed of the gallium nitride based semiconductor;

a second conductivity type cladding layer formed of the gallium nitride based semiconductor;

a current-blocking layer formed of the gallium nitride based semiconductor;

a second conductivity type contact layer;

a first electrode formed on a reverse surface of said SiC substrate; and a second electrode formed on said contact layer, wherein said gallium nitride based semiconductor of said current-blocking layer has a composition offset away from a stoichiometric composition thereof, said non-stoichiometric compound layer includes a compound layer satisfying the following condition:

$$(x_1+x_2+x_3) \neq y$$

in a composition formula expressed by:

$$In_{x_1}Ga_{x_2}Al_{x_3}N_yM_z$$

where M denotes an additive element to the gallium nitride based semiconductor and $x_1 \geq 0$, $x_2 \geq 0$, $x_3 \geq 0$, $y > 0$, and $z \geq 0$, and said compound layer comprises at least one of a compound layer in which a quotient obtained by dividing an absolute value of $(x_1+x_2+x_3-y)$ by y is greater than 0.0001 and a compound layer in which a quotient obtained by dividing an absolute value of $(x_1+x_2+x_3-y-z)$ by $(y+z)$ is greater than 0.0001.

* * * * *